United States Patent
Chen et al.

(10) Patent No.: US 11,616,502 B2
(45) Date of Patent: Mar. 28, 2023

(54) PHASE INTERPOLATOR AND CLOCK SIGNAL SELECTOR THEREOF

(71) Applicant: ALi Corporation, Hsinchu (TW)

(72) Inventors: Yi Ting Chen, Taipei (TW); Ming-Ta Lee, Taipei (TW)

(73) Assignee: ALi Corporation, Hsinchu (TW)

(*) Notice: Subject to any disclaimer, the term of this patent is extended or adjusted under 35 U.S.C. 154(b) by 0 days.

(21) Appl. No.: 17/537,513

(22) Filed: Nov. 30, 2021

(65) Prior Publication Data
US 2022/0190814 A1    Jun. 16, 2022

(30) Foreign Application Priority Data
Dec. 11, 2020   (CN) .......................... 202011457847.4

(51) Int. Cl.
*H03K 5/135*     (2006.01)
*H03K 5/00*      (2006.01)

(52) U.S. Cl.
CPC ... *H03K 5/135* (2013.01); *H03K 2005/00052* (2013.01)

(58) Field of Classification Search
CPC ......... H03K 5/135; H03K 2005/00052; H03K 5/133; H03K 5/13; H03K 5/1252; H03K 5/131; H03K 5/14; H03L 7/0814; H03L 7/081; H03L 7/0812; H03L 7/0816; H03L 7/0818; H03L 7/085; H03L 7/18; H03L 7/087; H03L 7/07; H03L 7/0807; H04L 7/0337; H04L 7/0338; H04L 7/0037; H04L 7/0025; G06F 1/08; G06F 1/06; G06F 1/10; G06F 1/04; G06F 1/12
See application file for complete search history.

(56) References Cited

U.S. PATENT DOCUMENTS

| | | | | |
|---|---|---|---|---|
| 6,359,486 | B1* | 3/2002 | Chen | H03L 7/0814 327/119 |
| 7,613,266 | B1* | 11/2009 | Talbot | H03K 5/135 327/147 |
| 8,384,458 | B1* | 2/2013 | Huang | H03K 5/131 327/175 |
| 9,048,843 | B1* | 6/2015 | Nordyke | G06F 1/06 |
| 2011/0102028 | A1* | 5/2011 | Nedachi | H03K 5/13 327/144 |

FOREIGN PATENT DOCUMENTS

TW        201406050        2/2014

* cited by examiner

Primary Examiner — John W Poos
(74) Attorney, Agent, or Firm — JCIPRNET

(57) ABSTRACT

A phase interpolator capable of preventing a glitch from being generated during a clock signal switching operation and a clock signal selector thereof are provided. The clock signal selector includes a selector and a selection signal generator. The selector receives multiple clock signals with different phases. The selector selects one of the clock signals according to a selection signal to generate a selected clock signal. The selection signal generator is coupled to the selector and generates the selection signal. When the selector switches from selecting a first clock signal to selecting a second clock signal as the selected clock signal, the selection signal generator generates a set time point according to a transition point of one of the first clock signal and the second clock signal whose phase lags behind a phase of the other, and generates the selection signal according to the set time point.

11 Claims, 8 Drawing Sheets

PHASE INTERPOLATOR AND CLOCK SIGNAL SELECTOR THEREOF

CROSS-REFERENCE TO RELATED APPLICATION

This application claims the priority benefit of China application no. 202011457847.4, filed on Dec. 11, 2020. The entirety of the above-mentioned patent application is hereby incorporated by reference herein and made a part of this specification.

BACKGROUND

Technical Field

The disclosure relates to a phase interpolator and a clock signal selector thereof, and in particular to a phase interpolator and a clock signal selector thereof capable of preventing an unnecessary glitch from being generated when a clock signal is being switched.

Description of Related Art

Referring to FIG. 1, FIG. 1 is a waveform diagram when a clock signal switching operation is executed according to the conventional technology. For example, in the technical field of phase interpolators, it is often necessary to switch between clock signals with different phases. In FIG. 1, when a selected clock signal MXCLK needs to be switched from a clock signal CLK<0> to a clock signal CLK<1>, in the conventional art, a time point T1 of a transition point of the clock signal CLK<0> is often set as a set time point for executing the clock signal switching operation. Under such conditions, in the conventional art, due to a transient effect of a selector that executes the clock signal switching operation, between the time point T1 and a time point T2, a part of the clock signal CLK<0> generates a glitch GS in the selected clock signal MXCLK through the selector, and an abnormality in an operation of the phase interpolator may occur.

SUMMARY

The disclosure relates to a phase interpolator and a clock signal selector thereof. The phase interpolator may prevent a glitch from being generated during a clock signal switching operation.

According to an aspect of the disclosure, a clock signal selector includes a selector and a selection signal generator. The selector receives multiple clock signals with different phases. The selector selects one of the clock signals according to a selection signal to generate a selected clock signal. The selection signal generator is coupled to the selector and generates the selection signal. When the selector switches from selecting a first clock signal as the selected clock signal to selecting a second clock signal as the selected clock signal, the selection signal generator generates a set time point according to a transition point of one of the first clock signal and the second clock signal whose phase lags behind a phase of the other, and generates the selection signal according to the set time point.

According to another aspect of the disclosure, a phase interpolator includes selectors of N stages, a selection signal generator, and an interpolation calculation circuit. Each of the selectors of N stages receives multiple clock signals with different phases. Each of the selectors of N stages receives N selection signals, and generates selected clock signals of N stages with different phases according to the N selection signals. N is an integer greater than 1. A phase of the selected clock signal of an $i^{th}$ stage is ahead of a phase of the selected clock signal of an $(i+1)^{th}$ stage. i is a positive integer less than N. The selection signal generator is used to generate the N selection signals. The selection signal generator generates the selection signal of the $i^{th}$ stage according to the selected clock signal of an $(i+M)^{th}$ stage. M is greater than or equal to 1. The interpolation calculation circuit executes an interpolation operation on two of the selected clock signals of N stages to generate an output clock signal.

According to the above, the clock signal selector according to the embodiments of the disclosure sets the set time point for executing the clock signal switching operation according to the transition point of one of the first clock signal and the second clock signal whose phase lags behind a phase of the other of the clock signal switching operation. Accordingly, a glitch generated due to an incomplete transition between the first clock signal and the second clock signal during the clock signal switching operation may be prevented, and a malfunction of the phase interpolator may be avoided.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
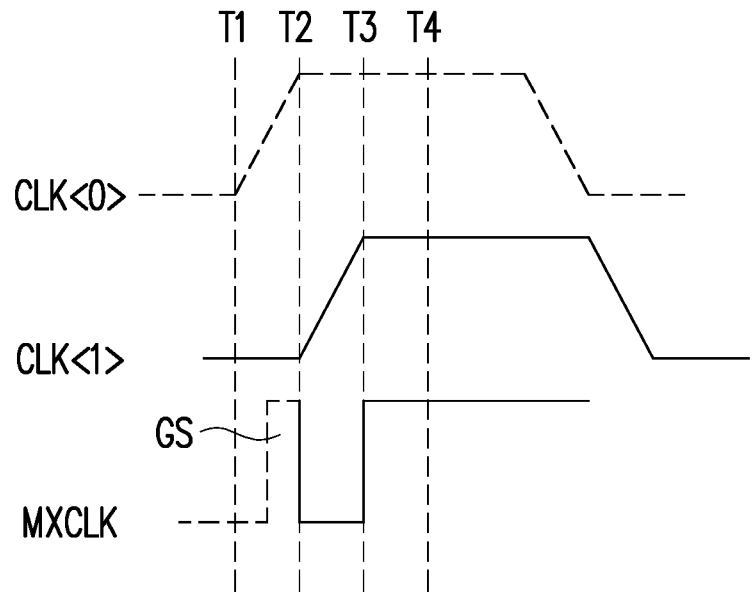
FIG. 1 is a waveform diagram of a clock signal switching operation in a conventional technology.

Reference will now be made in detail to the exemplary embodiments of the disclosure, examples of which are illustrated in the accompanying drawings. Wherever possible, the same reference numbers are used in the drawings and the description to refer to the same or like parts.

Figure 2:
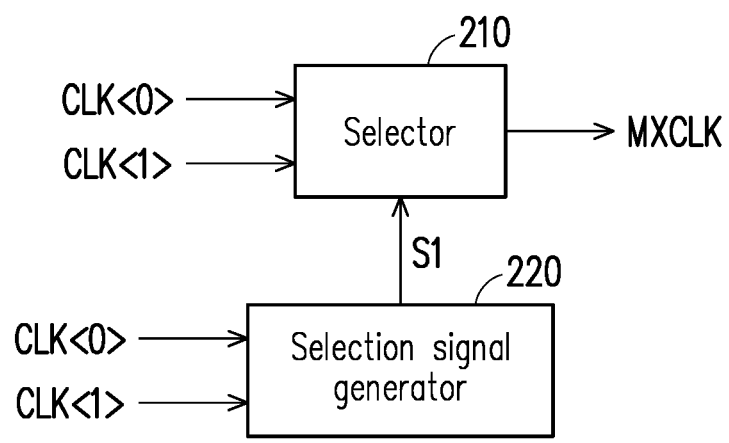
FIG. 2 is a schematic diagram of a clock signal selector according to an embodiment of the disclosure.

Referring to FIG. 2, FIG. 2 is a schematic diagram of a clock signal selector according to an embodiment of the disclosure. A clock signal selector 200 includes a selector 210 and a selection signal generator 220. The selector 210 receives multiple clock signals CLK<0> and CLK<1> with different phases. The selector 210 selects one of the clock signals CLK<0> and CLK<1> according to a selection signal S1 to generate a selected clock signal MXCLK. The selection signal generator 220 is coupled to the selector 210 and is used to generate the selection signal S1. In this embodiment, when the selector 210 switches from selecting the clock signal CLK<0> as the selected clock signal MXCLK to selecting the clock signal CLK<1> as the selected clock signal MXCLK, or when the selector 210 switches from selecting the clock signal CLK<1> as the selected clock signal MXCLK to selecting the clock signal CLK<0> as the selected clock signal MXCLK, the selection signal generator 220 may generate a set time point according to a transition point of one of the clock signals CLK<0> and clock signal CLK<1> whose phase lags behind a phase of the other, and generate the selection signal S1 according to the set time point.

Figure 3A:
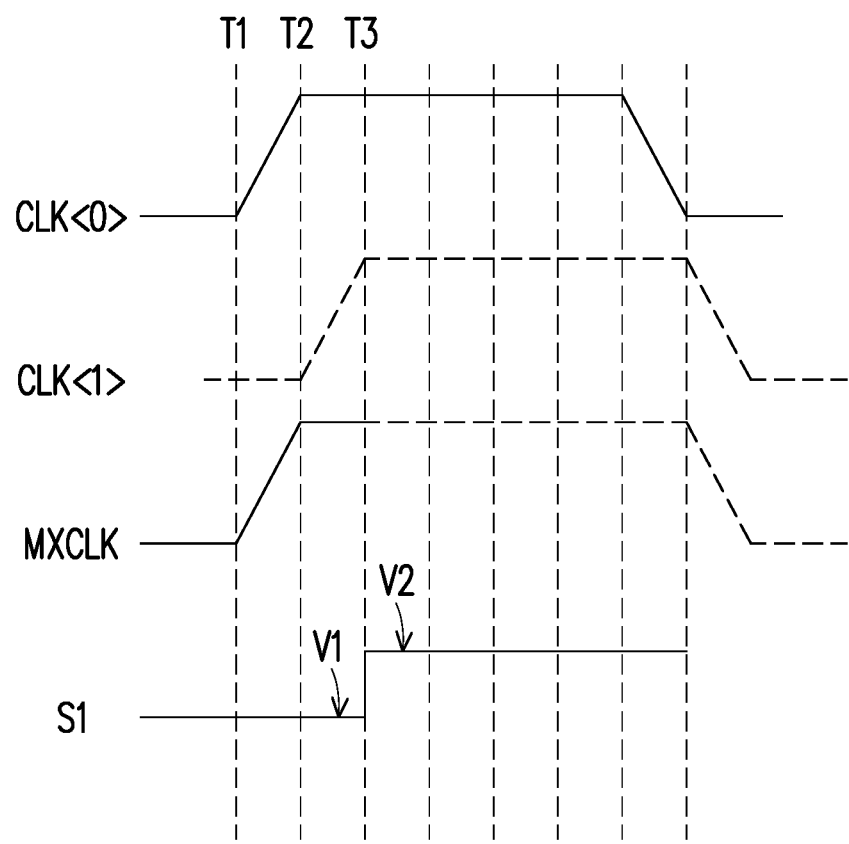
FIGS. 3A and 3B are operation waveform diagrams of a clock signal selector according to an embodiment of the disclosure.

In this embodiment, the phase of the clock signal CLK<0> may be ahead of the phase of the clock signal CLK<1>. Implementation details may be found in FIGS. 3A and 3B, which are operation waveform diagrams of a clock signal selector according to an embodiment of the disclosure. In FIG. 3A, when the clock signal selector 200 intends to switch the selected clock signal MXCLK from the clock signal CLK<0> to the clock signal CLK<1> (a phase lead mode), the selection signal generator 220 may set, as the set time point, a time point after a latency time from the transition point (a time point T2) of the clock signal CLK<0>. For example, the selection signal generator 220 may set the transition point of the clock signal CLK<1> as the set time point. In this embodiment, the selection signal generator 220 may set a time point T3 at which the clock signal CLK<1> whose phase lags behind transitions to a high voltage value as the set time point. The selection signal generator 220 sets the selection signal S1 to be at a first voltage value V1 before the set time point (the time point T3), and sets the selection signal S1 to be at a second voltage value V2 after the set time point (the time point T3). The selector 210 may select the clock signal CLK<0> to generate the selected clock signal MXCLK before the set time point (the time point T3) according to the selection signal S1 at the first voltage value V1, and select the clock signal CLK<1> to generate the selected clock signal MXCLK after the set time point (the time point T3) according to the selection signal S1 at the second voltage value V2.

At the set time point when the voltage value transition of the selection signal S1 occurs, the clock signals CLK<0> and CLK<1> have both been transitioned to a stable voltage value. Therefore, when a switching operation between the clock signals CLK<0> and CLK<1> is executed at the set time point, a glitch may be prevented from being generated in the selected clock signal MXCLK.

Figure 3B:
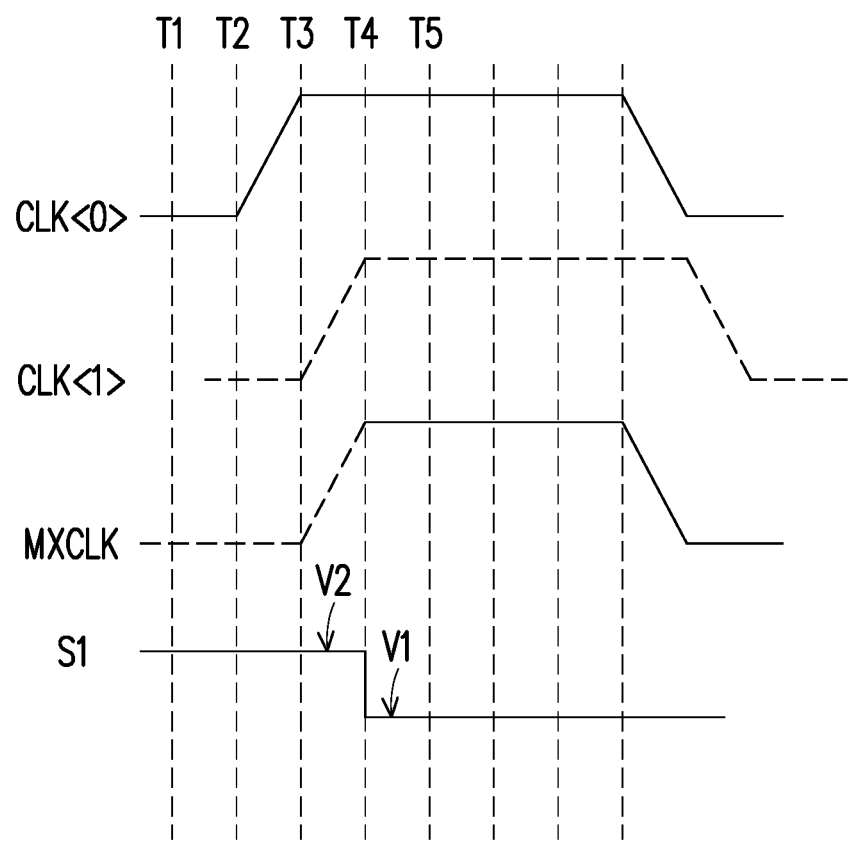

In FIG. 3B, when the clock signal selector 200 is in a phase lag mode, when the clock signal selector 200 switches the selected clock signal MXCLK from the clock signal CLK<1> to the clock signal CLK<0>, the selection signal generator 220 may set the transition point (a time point T4) of the clock signal CLK<1> as the set time point. The selection signal generator 220 may set the selection signal S1 to be at the second voltage value V2 before the set time point (the time point T4), and set the selection signal S1 to be at the first voltage value V1 after the set time point (the time point T4). The selector 210 may select the clock signal CLK<1> to generate the selected clock signal MXCLK before the set the time point (the time point T4) according to the selection signal S1 at the second voltage value V2, and select the clock signal CLK<0> to generate the selected clock signal MXCLK after the set time point (the time point T4) according to the selection signal S1 at the first voltage value V1.

Similarly, at the set time point when the voltage value transition of the selection signal S1 occurs, the clock signals CLK<0> and CLK<1> have both been transitioned to a stable voltage value. Therefore, when a switching operation between the clock signals CLK<0> and CLK<1> is executed at the set time point, a glitch in the selected clock signal MXCLK may be prevented from being generated.

In another example of this embodiment, the selection signal generator 220 may not set the time point T4 as the set time point, but may set a time point (for example, a time point T5) after a latency time from the transition point (the time point T4) of the clock signal CLK<1> whose phase lags behind the phase of the clock signal CLK<0> as the set time point. In this way, a glitch may also be prevented from being generated in the selected clock signal MXCLK.

The first voltage value V1 and the second voltage value V2 may be different logic values. In addition, while the first voltage value V1 and the second voltage value V2 may be different, the relation between the intensities of the first voltage value V1 and the second voltage value V2 is not particularly limited. In other embodiments of the disclosure, the first voltage value V1 may be greater than the second voltage value V2.

In addition, the selector 210 of the embodiments of the disclosure may also receive three or more clock signals. The selector 210 may switch the section between two of the clock signals, and generate the selected clock signal MXCLK. The selection signal generator 220 may generate the set time point according to the transition point of one of the selected first clock signal and second clock signal whose phase lags behind a phase of the other, and generate the selection signal S1. The selector 210 may select the first clock signal and the second clock signal to generate the selected clock signal MXCLK according to the selection signal S1. In this example, the selector 210 may execute a selection operation on the clock signals according to multiple voltage values of the selection signal S1 respectively corresponding to the clock signals. In addition, the selection signal S1 may also be implemented digitally; that is, the selection signal S1 may be a digital signal with multiple bits. The selection signal S1 may have multiple logic values to correspond to the clock signals, respectively.

In addition, the selector 210 of the embodiments of the disclosure may be implemented by a multiplexer circuit known to those skilled in the art. The disclosure is not particularly limited in this regard. The selection signal generator 220 may be implemented by a digital circuit. For example, a flip-flop (such as a D-type flip-flop) may be disposed in the selection signal generator 220 to detect the transition points of the clock signals CLK<0> and CLK<1> and generate a selection signal according to the detection result.

Figure 4:
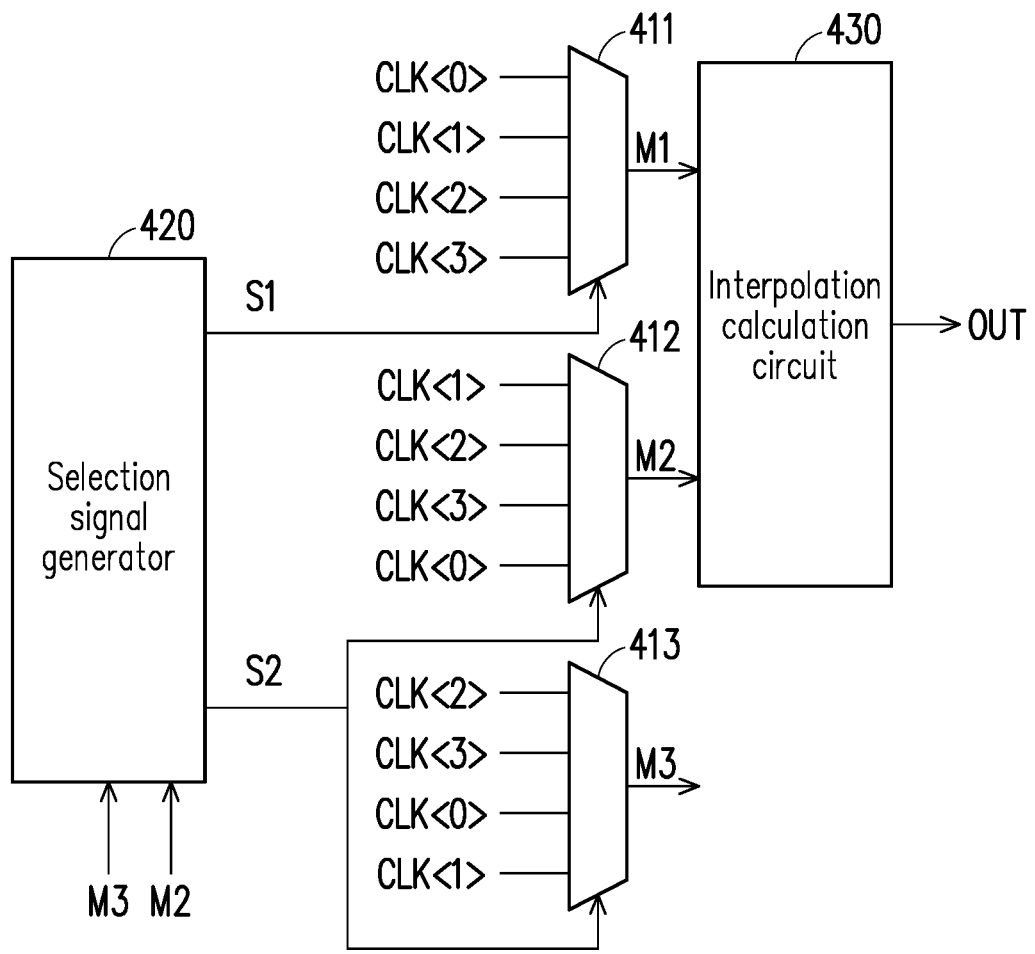
FIG. 4 is a schematic diagram of a phase interpolator according to another embodiment of the disclosure.

Referring to FIG. 4, FIG. 4 is a schematic diagram of a phase interpolator according to another embodiment of the disclosure. A phase interpolator 400 includes selectors 411 to 413 of multiple stages, a selection signal generator 420, and an interpolation calculation circuit 430. Each of the selectors 411 to 413 receives clock signals CLK<0> to CLK<3>. Phase differences are present from the clock signals CLK<0> to CLK<3> in sequence. The phase of the clock signal CLK<0> of the first stage is ahead of the phase of the clock signal CLK<1> of the second stage. The phase of the clock signal CLK<1> of the second stage is ahead of the phase of the clock signal CLK<2> of the third stage. The phase of the clock signal CLK<2> of the third stage is ahead of the phase of the clock signal CLK<3> of the fourth stage. The selectors 411 to 413 receive the selection signals S1, S2, and S2, respectively, and generate selected clock signals M1 to M3, respectively.

The selection signal generator 420 is used to generate the selection signals S1 and S2. The selection signal generator 420 generates the selection signal S1 of the first stage according to the selected clock signal M2 of the second stage, and generates the selection signal S2 of the second stage according to the selected clock signal M3 of the third stage. The selector 413 of the third stage (the last stage) generates the selected clock signal M3 of the third stage according to the selection signal S2 of the previous stage (the selection signal S2 of the second stage).

The selected clock signals M1 and M2 generated by the selectors 411 and 412, respectively, may be provided to the interpolation calculation circuit 430. The interpolation calculation circuit 430 is used to execute an interpolation operation on the selected clock signals M1 and M2 to generate an output clock signal OUT.

The interpolation calculation circuit 430 of the embodiments of the disclosure may be implemented by applying any clock interpolation circuit known to those skilled in the art, and the disclosure is not particularly limited in this regard. In addition, the number of the selectors 411 to 413 and the number of the clock signals CLK<0> to CLK<3> in this embodiment are only examples for illustration, and are not used to limit the scope of disclosure. The designer may change the number of the selectors 411 to 413 and the number of the clock signals CLK<0> to CLK<3> according to actual needs. The disclosure is not limited thereto.

Figure 5A:
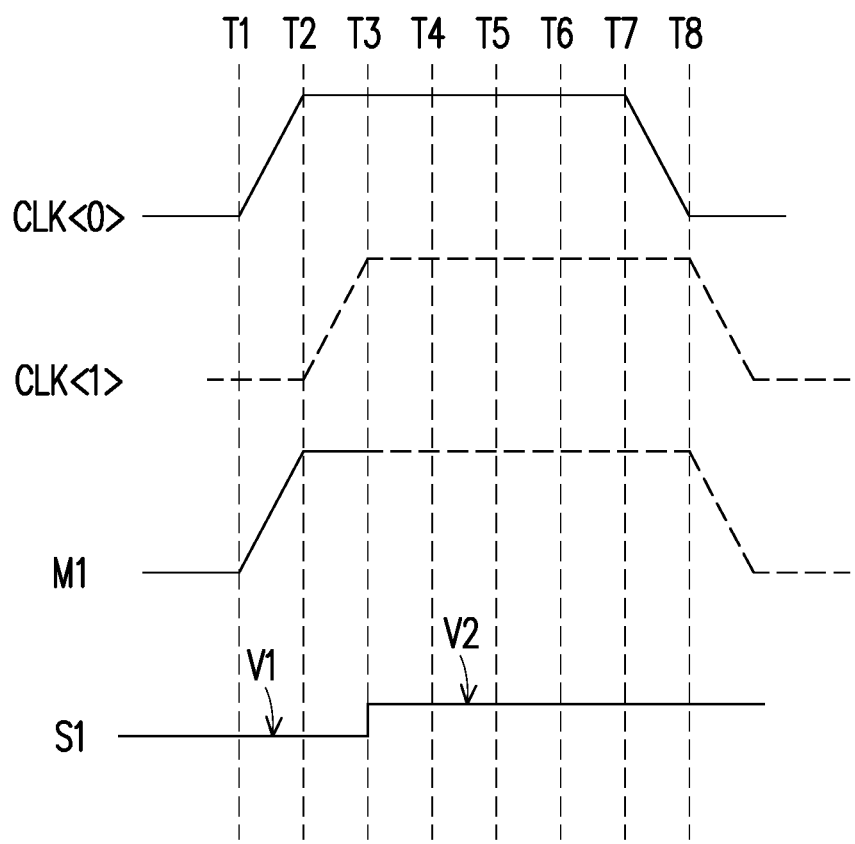
FIGS. 5A to 5C are operation waveform diagrams of a phase interpolator according to an embodiment of the disclosure.
Figure 5B:
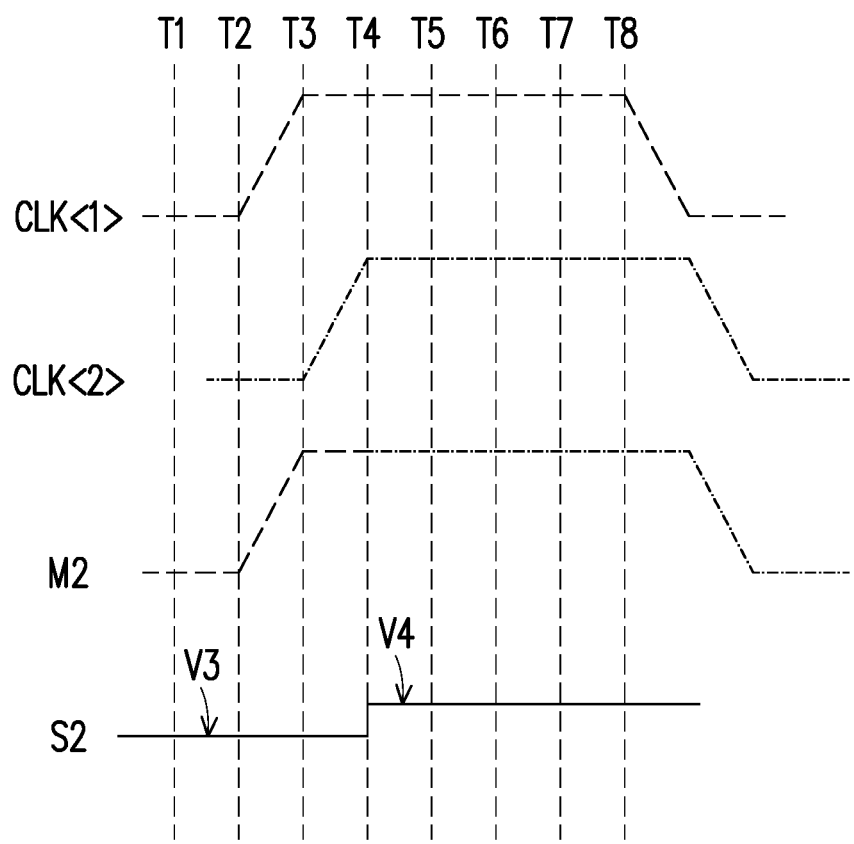
Figure 5C:
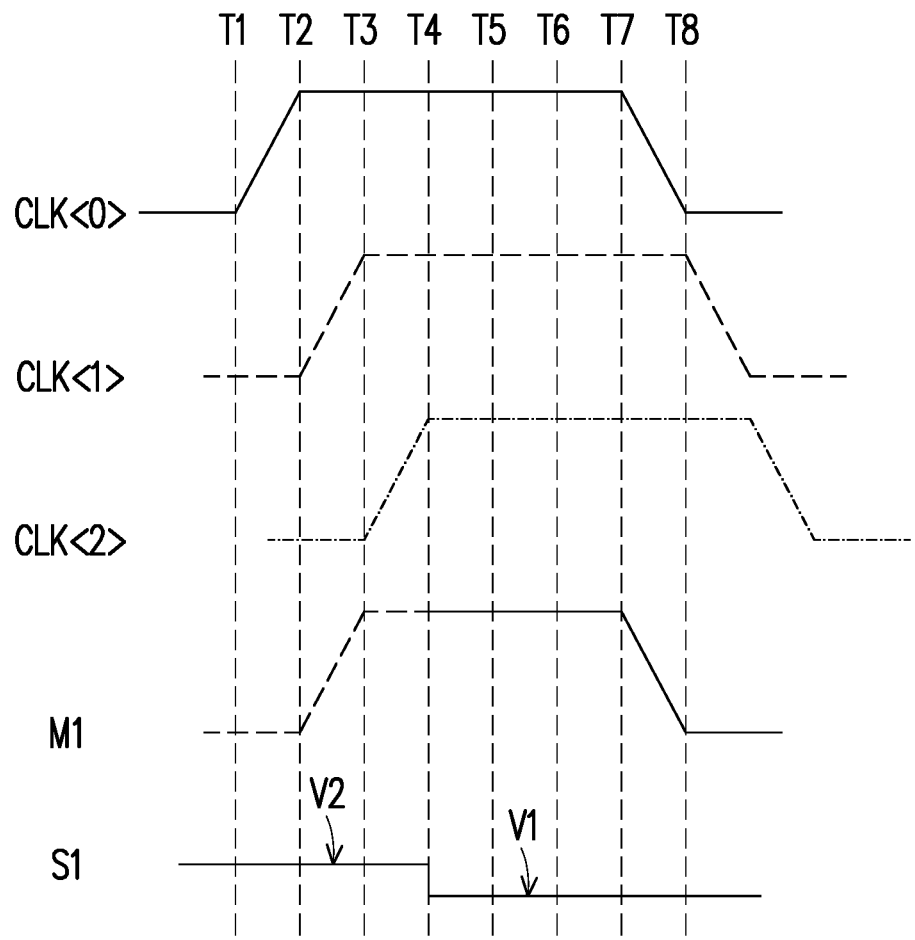

The operation details can be found in FIG. 4 and FIGS. 5A to 5C together. FIGS. 5A to 5C are operation waveform diagrams of a phase interpolator according to an embodiment of the disclosure. In FIGS. 5A and 5B, in a phase lead mode, the selectors 411 to 413 in a phase interpolator 500 switch from selecting the clock signals CLK<0>, CLK<1>, and CLK<2>, respectively, as the selected clock signals M1 to M3 to selecting the clock signals CLK<1>, CLK<2>, and CLK<3>, respectively, as the selected clock signals M1 to M3. At this time, in FIG. 5A, regarding the selector 411, the selection signal generator 420 may generate the selection signal S1 according to the selected clock signal M2 generated by the selector 412. Since the selected clock signal M2 generated by the selector 412 at this time is equal to the clock signal CLK<1>, the selection signal generator 420 may set the transition point (the time point T3) of the clock signal CLK<1> as the set time point, and generate the selection signal S1 according to the set time point. In detail, the selection signal generator 420 may set the selection signal S1 to be at the first voltage value V1 before the time point T3, and set the selection signal S1 to be at the second voltage value V2 after the time point T3. In this way, the selector 411 may select the clock signal CK<0> as the selected clock signal M1 before the time point T3 according to the selection signal S1 at the first voltage value V1, and select the clock signal CK<1> as the selected clock signal M1 after the time point T3 according to the selection signal S1 at the second voltage value V2.

On the other hand, in FIG. 5B, regarding the selector 412, the selection signal generator 420 may generate the selection signal S2 according to the selected clock signal M3 generated by the selector 413. Since the selected clock signal M3 generated by the selector 413 at this time is equal to the clock signal CLK<2>, the selection signal generator 420 may set the transition point (the time point T4) of the clock signal CLK<2> as the set time point, and generate the selection signal S2 according to the set time point. In detail, the selection signal generator 420 may set the selection signal S2 to be at a third voltage value V3 before the time point T4, and set the selection signal S2 to be at a fourth voltage value V4 after the time point T4. In this way, the selector 412 may select the clock signal CK<1> as the selected clock signal M2 before time point T4 according to the selection signal S2 at the third voltage value V3, and select the clock signal CK<2> as the selected clock signal M2 after the time point T4 according to the selection signal S2 at the fourth voltage value V4.

The first voltage value V1 to the fourth voltage value V4 described above may also be implemented by different first to fourth logic values.

In addition, in FIG. 5C, in a phase lag mode, the selectors 411 to 413 in the phase interpolator 400 switch from selecting the clock signals CLK<1>, CLK<2>, and CLK<3>, respectively, as the selected clock signals M1 to M3 to selecting the clock signals CLK<0>, CLK<1>, and CLK<2>, respectively, as the selected clock signals M1 to M3. Regarding the selector 411, the selection signal generator 420 may generate the selection signal S1 according to the selected clock signal M2 generated by the selector 412. Since the selected clock signal M2 generated by the selector 412 at this time is equal to the clock signal CLK<2>, the selection signal generator 420 may set the transition point (the time point T4) of the clock signal CLK<2> as the set time point, and generate the selection signal S1 according to the set time point. In detail, the selection signal generator 420 may set the selection signal S1 to be at the second voltage value V2 before the time point T4, and set the selection signal S1 to be at the first voltage value V1 after the time point T4. In this way, the selector 411 may select the clock signal CK<1> as the selected clock signal M1 before the time point T4 according to the selection signal S1 at the second voltage value V2, and select the clock signal CK<0> as the selected clock signal M1 after the time point T4 according to the selection signal S1 at the first voltage value V1.

In the above description, the switching operation between the clock signals CLK<0> to CLK<3> is executed when the clock signals have been transitioned to and maintain at a stable voltage value. Therefore, during the switching operation, a glitch may be prevented from being generated in the selected clock signal.

Figure 6:
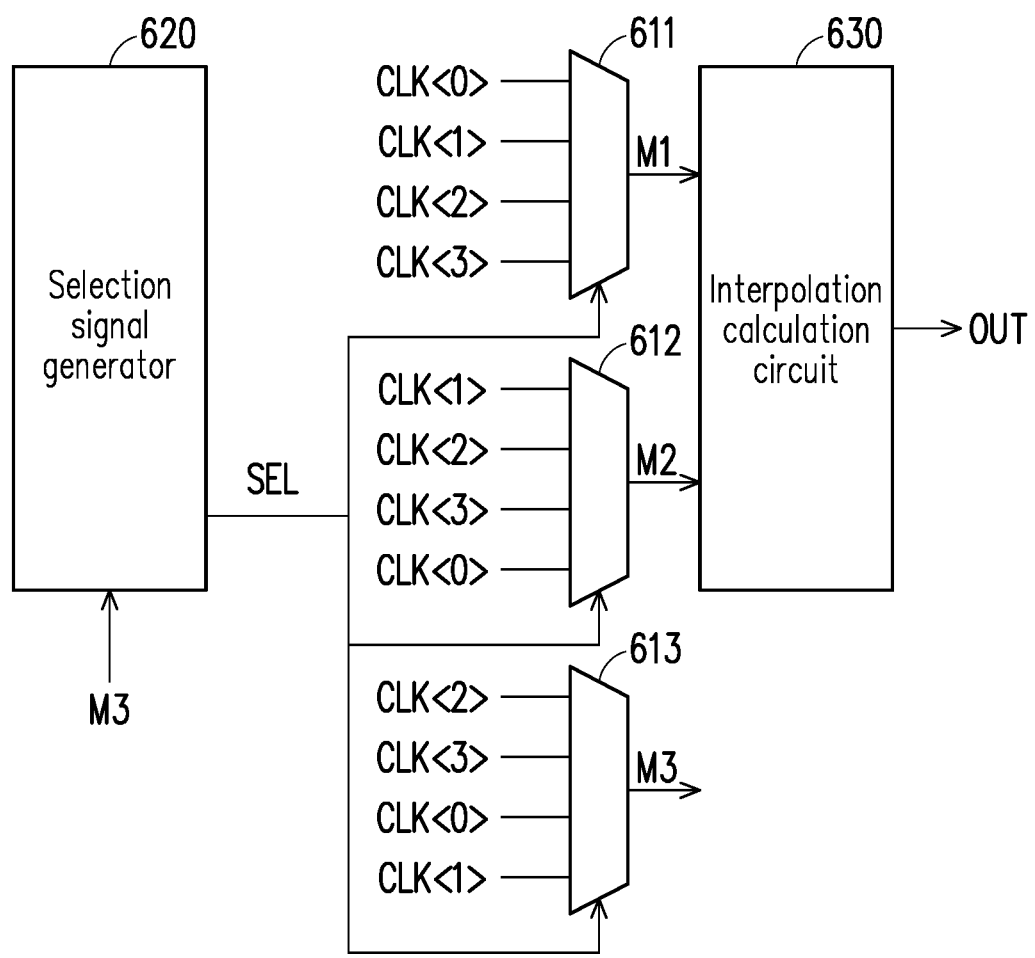
FIG. 6 is a schematic diagram of a phase interpolator according to another embodiment of the disclosure.

Referring to FIG. 6, FIG. 6 is a schematic diagram of a phase interpolator according to another embodiment of the disclosure. A phase interpolator 600 includes selectors 611 to 613 of multiple stages, a selection signal generator 620, and an interpolation calculation circuit 630. Each of the selectors 611 to 613 receives the clock signals CLK<0> to CLK<3> with different phases. The phase of the clock signal CLK<0> of the first stage is ahead of the phase of the clock signal CLK<1> of the second stage. The phase of the clock signal CLK<1> of the second stage is ahead of the phase of the clock signal CLK<2> of the third stage. The phase of the clock signal CLK<2> of the third stage is ahead of the phase of the clock signal CLK<3> of the fourth stage. The selectors 611 to 613 generate the selected clock signals M1 to M3, respectively. The selected clock signals M1 and M2 are transmitted to the interpolation calculation circuit 630. The interpolation calculation circuit 630 may execute an interpolation operation on the selected clock signals M1 and M2 to generate the output clock signal OUT.

Different from the implementation in FIG. 4, the selectors 611 to 613 receive a same selection signal SEL, and the selection signal generator 620 generates the selection signal SEL according to the selected clock signal M3 with the largest phase lag among the selected clock signals M1 to M3. In other words, the selectors 611 to 613 execute a switching operation between the clock signals after a sufficiently long latency, thereby preventing a glitch from being generated.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A clock signal selector, comprising:
   a selector, receiving a plurality of clock signals with different phases, wherein the selector selects one of the plurality of clock signals according to a selection signal to generate a selected clock signal, wherein the plurality of clock signals comprise a first clock signal and a second clock signal; and
   a selection signal generator, coupled to the selector, and generating the selection signal,
   wherein when the selector switches from selecting the first clock signal as the selected clock signal to selecting the second clock signal as the selected clock signal, the selection signal generator generates a set time point according to a specific transition point, and generates the selection signal comprising a first sub-signal before the set time point and a second sub-signal after the set time point,
   wherein the first sub-signal of the selection signal is associated with one of the first clock signal and the second clock signal, and the second sub-signal of the selection signal is associated with the other of the first clock signal and the second clock signal,
   wherein in response to a phase of the first clock signal lagging behind a phase of the second clock signal, the specific transition point is a transition point of the first clock signal,
   wherein in response to the phase of the second clock signal lagging behind the phase of the first clock signal, the specific transition point is a transition point of the second clock signal.

2. The clock signal selector according to claim 1, wherein the phase of the first clock signal is ahead of the phase of the second clock signal.

3. The clock signal selector according to claim 2, wherein the selection signal generator sets the transition point of the second clock signal as the set time point, the selection signal generator sets the selection signal to be at a first voltage value before the set time point, and the selection signal generator sets the selection signal to be at a second voltage value after the set time point, wherein when the selection signal is at the first voltage value, the selector selects the first clock signal as the selected clock signal, and when the selection signal is at the second voltage value, the selector selects the second clock signal as the selected clock signal.

4. The clock signal selector according to claim 1, wherein the phase of the first clock signal lags behind the phase of the second clock signal.

5. The clock signal selector according to claim 4, wherein the selection signal generator sets, as the set time point, a time point after a latency time from the transition point of the first clock signal, the selection signal generator sets the selection signal to be at a first voltage value before the set time point, and the selection signal generator sets the selection signal to be at a second voltage value after the set time point, wherein when the selection signal is at the first voltage value, the selector selects the first clock signal as the selected clock signal, and when the selection signal is at the second voltage value, the selector selects the second clock signal as the selected clock signal.

6. A phase interpolator, comprising:
   selectors of N stages, wherein each of the selectors of N stages receives a plurality of clock signals with different phases, each of the selectors of N stages receives N selection signals, each of the selectors of N stages generates selected clock signals of N stages with different phases according to the N selection signals, and N is an integer greater than 1, wherein a phase of a selected clock signal of an $i^{th}$ stage is ahead of a phase of a selected clock signal of an $(i+1)^{th}$ stage, and i is a positive integer less than N;
   a selection signal generator, adapted for generating the N selection signals, wherein the selection signal generator generates the selection signal of the $i^{th}$ stage according to a selected clock signal of an $(i+M)^{th}$ stage, and M is greater than or equal to 1; and
   an interpolation calculation circuit, executing an interpolation operation on two of the selected clock signals of N stages to generate an output clock signal.

7. The phase interpolator according to claim 6, wherein a selector of the $N^{th}$ stage generates a selected clock signal of the $N^{th}$ stage according to a selection signal of an $(N-1)^{th}$ stage.

8. The phase interpolator according to claim 6, wherein the selection signal generator generates a set time point according to a transition point of the selected clock signal of the $(i+M)^{th}$ stage, the selection signal generator sets the selection signal of the $i^{th}$ stage to be at a first voltage value before the set time point, and the selection signal generator sets the selection signal of the $i^{th}$ stage to be at a second voltage value after the set time point.

9. The phase interpolator according to claim 6, wherein the selection signal generator generates a set time point after a latency time from a transition point of the selected clock signal of the $(i+M)^{th}$ stage, the selection signal generator sets the selection signal of the $i^{th}$ stage to be at a first voltage value before the set time point, and the selection signal generator sets the selection signal of the $i^{th}$ stage to be at a second voltage value after the set time point.

10. The phase interpolator according to claim 8, wherein a selector of the $i^{th}$ stage selects a first clock signal to generate the selected clock signal of the $i^{th}$ stage when the selection signal of the $i^{th}$ stage is at the first voltage value, and the selector of the $i^{th}$ stage selects a second clock signal to generate the selected clock signal of the $i^{th}$ stage when the selection signal of the $i^{th}$ stage is at the second voltage value, wherein in a phase lead mode, a phase of the first clock signal is ahead of a phase of the second clock signal, and in a phase lag mode, the phase of the first clock signal lags behind the phase of the second clock signal.

11. The phase interpolator according to claim 9, wherein a selector of the $i^{th}$ stage selects a first clock signal to generate the selected clock signal of the $i^{th}$ stage when the selection signal of the $i^{th}$ stage is at the first voltage value, and the selector of the $i^{th}$ stage selects a second clock signal to generate the selected clock signal of the $i^{th}$ stage when the selection signal of the $i^{th}$ stage is at the second voltage value, wherein in a phase lead mode, a phase of the first clock signal is ahead of a phase of the second clock signal, and in a phase lag mode, the phase of the first clock signal lags behind the phase of the second clock signal.

* * * * *